United States Patent [19]

Foch et al.

[11] Patent Number: 4,727,272
[45] Date of Patent: Feb. 23, 1988

[54] DRIVE-INTERFACE FOR A STATIC ELECTRONIC SWITCH WITH CONTROLLED "OFF"

[75] Inventors: Henri Foch; Jacques Roux, both of Toulouse, France

[73] Assignee: A.N.V.A.R., Paris, France

[21] Appl. No.: 829,139

[22] PCT Filed: May 13, 1985

[86] PCT No.: PCT/FR85/00115
§ 371 Date: Jan. 16, 1986
§ 102(e) Date: Jan. 16, 1986

[87] PCT Pub. No.: WO85/05512
PCT Pub. Date: Dec. 5, 1985

[30] Foreign Application Priority Data
May 16, 1984 [FR] France ............................ 84 07708

[51] Int. Cl.$^4$ ................ H03K 17/72; H03K 17/04; H03K 17/60; H03K 17/687
[52] U.S. Cl. ............................ 307/633; 307/253; 307/571; 323/235; 323/319
[58] Field of Search ........ 307/252 R, 252 C, 252 UA, 307/253, 254, 262, 315, 571; 323/235, 319

[56] References Cited
U.S. PATENT DOCUMENTS

| | | | |
|---|---|---|---|
| 3,633,094 | 1/1972 | Clements | 307/252 UA |
| 3,728,557 | 4/1973 | Pelly et al. | 307/252 UA |
| 4,330,819 | 5/1982 | Foch et al. | 363/132 |
| 4,528,494 | 7/1985 | Bloomer | 323/235 |

FOREIGN PATENT DOCUMENTS

| | | | |
|---|---|---|---|
| 0085140 | 6/1980 | Japan | 307/252 C |
| 0085574 | 5/1982 | Japan | 307/252 C |

Primary Examiner—John Zazworsky
Attorney, Agent, or Firm—Harold H. Dutton, Jr.

[57] ABSTRACT

The invention concerns a drive interface (1) for an electronic static switch (3) such as a blocking thyristor or a transistorized blocking switch; this interface is inserted between said static switch and a control stage (2) designed to generate a logic control signal. Said interface comprises a circuit (5) for detecting the voltage across the two power electrodes of the static switch (3) and a drive circuit (6) receiving the signal emitted from the circuit (5) and the control signal; this drive circuit is designed to assure a polarity on the control electrode (3c) of the static switch such that:

said polarity corresponds to blocking the switch when the control signal carries an OFF command, and/or the voltage across the power electrodes is different from 0, said polarity corresponds to the conduction state of the switch when the control signal corresponds to permission to conduct an the voltage across the power electrodes is near 0.

8 Claims, 14 Drawing Figures

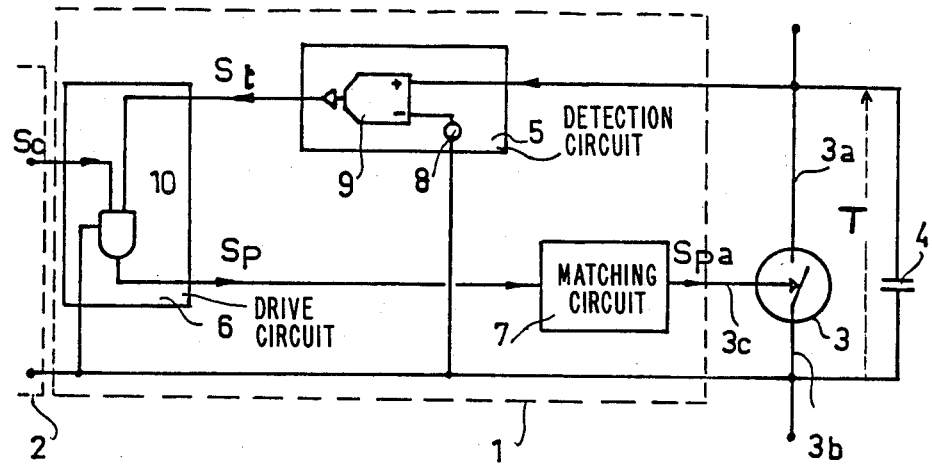
Fig. 1
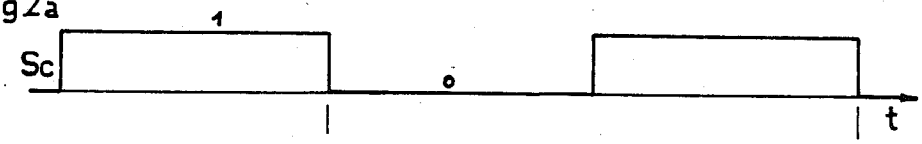
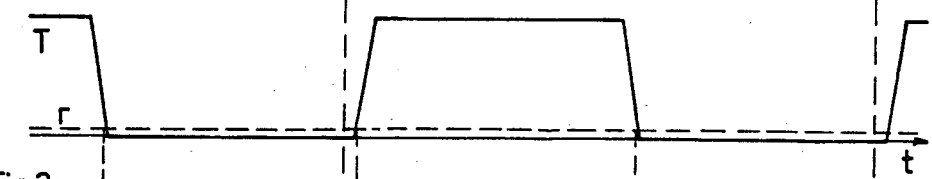
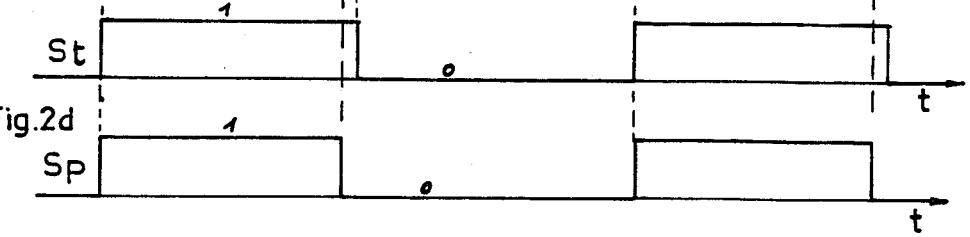

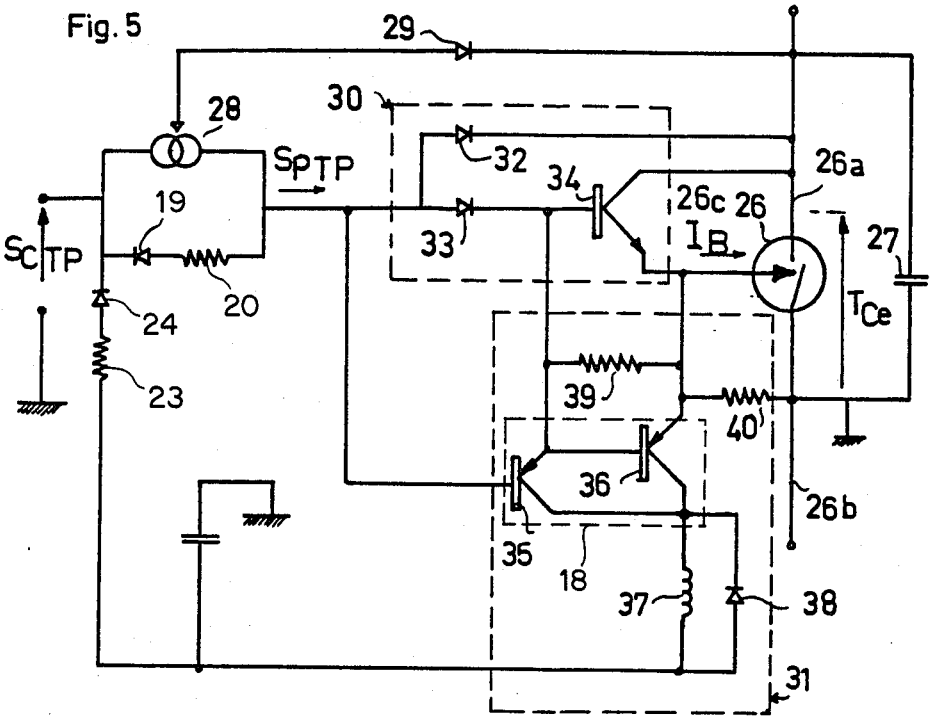
Fig. 5
Fig. 6a Tce
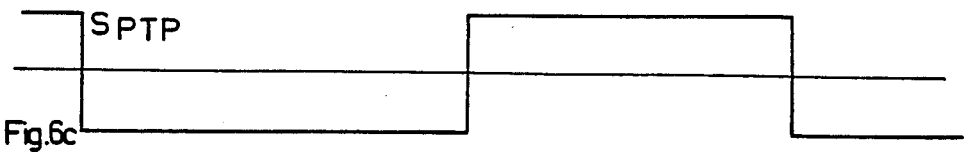
Fig. 6b SPTP
Fig. 6c IB

DRIVE-INTERFACE FOR A STATIC ELECTRONIC SWITCH WITH CONTROLLED "OFF"

The invention relates to a drive-interface for a static electronic switch with a controlled blocking (OFF), in particular a semiconducting switch. The object of the invention is an interface to be inserted between said static switch and a control stage designed to generate a switch control signal as a function of the application to which the invention is put.

The invention applies to a static switch with a controlled blocking (OFF), that is, capable, upon an OFF command, to break the current through said switch the moment the said OFF command appears. In particular the invention applies to blocking thyristors, field-effect transistors, blocking static switches constituted by transistor systems. The invention does not apply to such components as conventional thyristors, triacs, of which the control electrode may institute conduction but is incapable of causing instant blocking. The conduction of these latter components follows a very specific logic wholly unrelated to that of the former ones, and their scope of application is entirely different.

The static switches which are the object of the invention can be defined as:

having at least one control electrode and two power electrodes, being capable of being in at least two states, a conduction state characterized by a low voltage drop across the power electrodes, and blocking state characterized by low leakage current between these electrodes, and being characterized by the two states corresponding to different polarities of the control electrode, each change being due to a change of state of that electrode.

A static converter employing transistors of which the voltage bias $V_{CEX}$ (voltage bias at zero collector current and negatively biased base) is much higher than its voltage bias $V_{CEO}$ (open-bias voltage base) is described in the French patent 78.32428 or U.S. Pat. No. 4,330,819, and more particularly, so are "inverted mesa" transistors. This converter includes an intermediate processing stage for the control signal of the above cited transistor(s), designed to make use in wholly reliable manner of the range of applied voltages between $V_{CEO}$ and $V_{CEX}$ so as to considerably broaden the range of supply voltages for the converter. One of the objects of this patent is to create a converter for the rectified industrial potentials of 380 volts.

The present invention excludes the above cited transistors and its purpose is to drive other components comprising static semiconducting switches with controlled OFF as defined above (blocking thyristors, field-effect transistors . . . ).

The main object of the invention is to create a drive interface for these switches which in conjunction with these assumes the overall function of a switch that is rendered spontaneously conducting and which can be controlled to be blocking (OFF), where this function corresponds to a DUAL logic of a conventional thyristor (the operational logic of a thyristor being the control at turn-on and for spontaneous OFF).

Another object of the invention is to fill the above cited function by assuring switching at very low power losses.

Yet another object of the invention is to eliminate the need for accessory circuits for turn-on switching and to avoid all their inherent constraints (recovery dead times, power dissipation). Therefore the accessory switching circuits can be made specific to OFF switching and essentially be capacitive, so as to entail neither dead recovery times nor dissipation of stored energy.

A further object of the invention and deriving from the two proceeding ones is to expand the frequency range of the typical operation of the driven static switch(es).

To that end and in conformity with the invention, a drive interface is inserted between the static switch and the control stage associated with said switch to control its switching in sequences determined by the application (this control stage generating a control signal composed of permission to conduct and OFF commands). The drive interface comprises:

a circuit detecting the voltage across the two power electrodes of the static switch and designed to generate a signal, called the voltage signal, which is a function of that voltage difference, a drive circuit designed to receive on one hand the voltage signal from the detection circuit and on the other hand the control signal generated by the control stage and designed:

to assure a polarity on the control electrode corresponding to blocking the static switch in these cases, (a) and/or (b):

(a) the control signal corresponds to an OFF signal, (b) the voltage across the electrodes is different from zero (i.e., not near 0), and to assure there be a polarity on the control electrode corresponding to the conduction state of the static switch only in the case (ā) and (b̄):

(ā) the control signal corresponds to permission to conduct (b̄) the voltage across the power electrodes is near 0.

In this manner the above cited drive interface allows eliminating any forced turn-on of the static switch. This is because for each switching operation, this interface approves switch turn-on if the voltage across the power electrodes vanished in natural manner. Thereby the power losses during turn-on switching are totally eliminated.

In particular the invention applies to driving blocking thyristors ("G.T.O."), or field-effect transistors with or without insulated gates, and to systems of bipolar transistors.

Futhermore the interface of the invention making possible a natural, uncontrolled turn-on of the static switch is particularly well suited to drive a static switch of which the power electrodes are provided with an essentially capacitive circuit assisting the switching in order to shunt the current between these electrodes during the turn-off switching. In this manner the dead times and the power losses resulting from the dissipation of stored energy are eliminated.

The description below and related to the attached drawings presents illustrative and non-limiting embodiments of the invention; these drawings are an integral part of the present description.

FIG. 1 is a block diagram of the overall drive circuit of the invention,

FIGS. 2a, 2b, 2c, and 2d are time-graphs of the main signals,

FIG. 3 is an electronic circuit diagram of said interface for driving a "G.T.O." turn-off thyristor, FIGS. 4a, 4b, 4c and 4d are time-graphs relating to the assembly of FIG. 3, FIG. 5 is an electronic circuit diagram of another interface embodiment designed to drive a static switch comprising bipolar power transistors mounted in particular in the Darlington mode, FIGS. 6a, 6b and 6c are time-graphs relating to the assembly of FIG. 5.

The drive interface shown as 1 in FIG. 1 is to produce a control signal generated by a control stage 2 in order to drive an electronic static switch 3 which in this instance is associated with a switching-assisting capacitor 4. At the moment when the switch is turned OFF, this capacitor shunts the current passing through said switch while limiting the voltage gradient across the power electrodes when the switch is OFF.

The switch comprises two power electrodes 3a, 3b connected to the power circuit in order to control the power exchanges of this circuit. Also this switch includes a control electrode 3c of which the polarity determines the states of the switch. This switch may be in two states: a conducting state for a given polarity of the control electrode 3c, for instance positive, and an OFF state for a different polarity, for instance negative.

The drive interface 1 inserted between the control stage 2 and the static switch 3 includes a detection circuit 5 connected to the power electrodes 3a and 3b of the switch 3 to generate a voltage signal St which is a function of the magnitude of the voltage T across the power electrodes.

The interface 1 also includes a drive circuit 6 connected to the control stage 2 and to the detection circuit 5 to generate a polarity signal Sp from the control signal Sc and the voltage signal St. In this example, this polarity signal next is matched to the kind of static switch being used by a matching circuit 7 emitting a polarity signal Spa allowing to optimize the switch control.

The detection circuit 5 includes a reference voltage generator 8 providing a reference voltage "r" which is very small compared to the maximum voltage T across the power electrodes 3a, 3b; the value of r is selected so that when the voltage T across the power electrodes drops below the value of this reference voltage r, the switch turn-on entails only negligible losses; the voltage r may be about 1/100 the maximum value of voltage T.

The circuit 5 further includes an inverting comparator 9 connected to the power electrodes and to the generator 8. This comparator emits a two-state voltage signal St depending on the relative values of the voltages r and T across the power electrodes.

FIG. 2b shows the voltage T across the power electrodes and the reference voltage r. FIG. 2c shows the voltage signal St. This signal has two states:

one state is symbolized by the logic level 1 in this FIGURE and corresponds to a voltage T less than r, that is, near zero;

the other state is symbolized by the logic level 0 and corresponds to a voltage T larger than r, that is not near 0.

The drive circuit 6 furthermore includes a logic unit 10 to produce a logic function, which in this instance is the AND function from the voltage signal St emitted by the circuit 5 and from the control signal Sc emitted by the control stage 2.

This control signal Sc is illustrated in FIG. 2a; it has two levels, one being symbolized by the logic state 1 and corresponding to permission to conduct, the other symbolized by the logic level 0 and corresponding to an OFF command. This control signal Sc is generated in each application to produce the desired operations in the static switch 3.

The logic unit 10 generates on the basis of the Sc and the St signals a two-level polarity signal (FIG. 2d), namely:

one level, denoted by 1 in FIG. 2d, which corresponds to the conduction state in the switch 3 and operative when Sc =1 and St=1, another level denoted by 0 and corresponding to the OFF condition of the switch 3, this latter level being the case at all other times, that is when Sc=0 or St=0.

The matching circuit 7 is a function of the type of switch being used and will be illustrated further below; it emits a matched polarity signal Spa which has an analog shape synchronous with the Sp signal, said shape being fitted to the control requirements of the switch 3 being considered.

On the rising jump of the Sp signal, the static switch is made conducting by a corresponding polarity on its control electrode; this control input corresponds to a conduction command from the Sc signal, but is shifted from this latter until the voltage T across the power electrodes vanishes. Thus the turn-on is controlled by the interface only for T voltages near 0, whereby the turn-on power losses become negligible.

The switching assistance circuit may consist of a mere capacitor 4 because the aforementioned drive system prohibits turning on the static switch as long as the capacitor remains at least somewhat charged. Therefore, the switch never is subjected to excessive capacitor discharges when being made conducting.

Be it noted that the drive interface 1 object of the invention does not cause the vanishing of the voltage T across the power electrodes; this required disappearance must be caused by the circuit external to the switch, either inherently due to its configuration and its operating conditions (for instance by a modulator shaping a non-modulated voltage and feeding an inductive circuit), or by the action of an accessory circuit designed to cause this vanishing (for instance nondissipative reactive circuits such as oscillators, inductors ..., or auxiliary static switches associated with latter).

FIG. 3 shows a drive interface for a blocking thyristor (GTO) 11 of which the power electrodes, here denoted as anode and cathode, are referenced by 11a and 11b, and where the control electrode, denoted as gate, is referenced by 11c. A switching assisting caacitor 21 is in parallel with the anode and cathode of the blocking thyristor.

The control stage is applied to the drive interface by an isolating transformer 12 and simultaneously feeds the control signal Scth to this interface; this signal Scth at the secondary of the transformer has a maximum positive amplitude which acts as the reference voltage r and which is very low compared to the maximum voltage across the anode and cathode of the blocking thyristor.

The voltage Tth across anode and cathode is sensed by a transistor 13 of which the base is connected through a diode 15 and a resistor 14 to the anode 11a, said diode being forward conducting from the transistor 13 to the anode 11a.

The emitter of the transistor 13 is connected to the transformer 12 through a diode 16 and a resistor 17. In this manner this transistor 13 also acts as an AND logic unit (10) since it can only conduct when the following conditions are present simultaneously:

positive control signal Scth,
AND

Tth voltage less than the value of Scth, that is near 0.

(The two diodes 16 and 15 become conducting when these conditions are met simultaneously, in which case the base of the transistor 13 then is energized.)

The drive circuit furthermore includes a transistor 18 arranged to transmit blocking control signal Scth to the gate 11c of the blocking thryistor. To that end, a diode 19 and a resistor 20 transmit the control signal provided by the transformer 12 to the base of transistor 18. For negative control signals, the transistor 18 blocks the thyristor 11 due to the negative gate polarity.

This polarity is supplied by a capacitor 22 in series with a resistor 23 and a diode 24, allowing recharging the capacitor at each negative alternation voltage of the control signal Scth.

The matching function is implemented on one hand by the transistors 13 and 18 mentioned above and on the other hand by a transistor 25 designed to shunt the base/emitter junction of transistor 13 to stabilize the current from the latter; this current is sensed by the aforementioned resistor 17.

The moment the gate/cathode junction of the thyrstor 11 is blocked, the transistor 18 stops conducting; thereupon it only assures a negative polarity on said junction.

Therefore the above described circuit meets the already cited functions of the drive interface, however, for simplification, several of its components take part in several functions: illustratively, the transistor 13 simultaneously is a sensor, a drive means and a matching means. These multiple functions are schematically shown in FIG. 3 by drawing therein the base circuits with overlaps of the components which are part of several circuits (the references 5, 6 and 7 of FIG. 1 are used again for these base circuits).

It must be kept in mind also that the particular arrangement of the components of the interface shown furthermore implements an overall differentiating role generating opposite pulses during the turn-on of the thyristor 13 and during the triggering of the transistor 18. In other circuit embodiments, one may provide a differentiator (capacitor or other) to implement this function.

FIG. 4a shows the control signal Scth (secondary of the transformer 12),

FIG. 4b shows the voltage signal Tth (across anode and cathode of the the thyristor 11, FIG. 4c shows the gate current $I_Gth$ controlling the switching of the thyristor 11, FIG. 4d shows the anode current $I_Ath$, which reflects the thyristor operation.

In this example, the signal Scth is a square wave.

Figure 3:
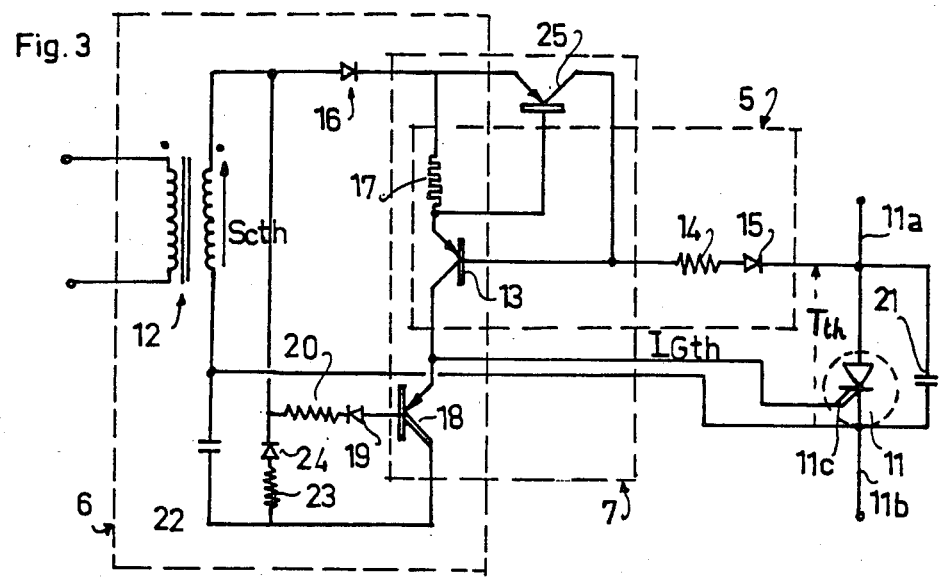
Figure 4A:
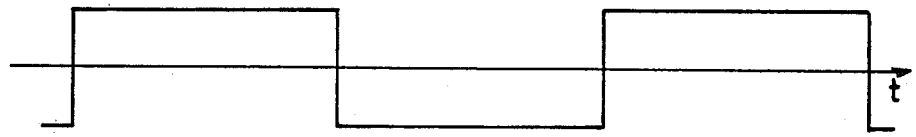
FIGS. 4a, 4b, 4c and 4d show the shapes of the main signals of the above cited interface.
Figure 4B:
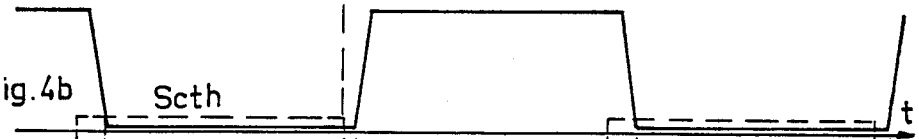
Figure 4C:
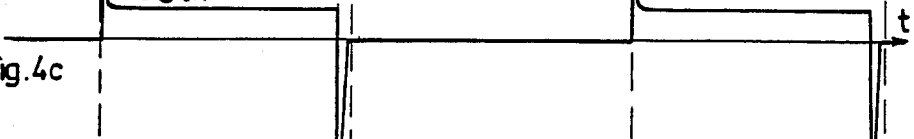

When the signal Tth drops below the signal Scth, the matching circuit 7 feeds a positive turn-on pulse to the blocking thyristor gate, whereby this thyristor becomes conducting (FIG. 4c). Thereupon this circuit emits a latch signal over the entire conduction period. Lastly, on the trailing edge of the signal Scth, this circuit generates a negative gate current pulse (blocking pulse) which produces the thyristor blocking state.

Figure 4D:

The anode current Iath is shown in FIG. 4d and appears between the two turn-on and turn-off pulses of the gate current when allowed by the external circuit fed by the thyristor. The thyristor is blocked, and hence its anode current is canceled, when the gate-current blocking pulse appears.

FIG. 5 shows a drive interface of a static switch 26 consisting of a system of bipolar transistors, in particular in the Darlington mode. The power electrodes of this switch are denoted by 26a and 26b and the control electrode by 26c; a switching assisting capacitor 27 is in parallel with the power electrodes of the switch 26.

The drive interface configuration overall is the same as in the previous case, except that the matching function in this case includes two specific circuits further described below and framed in dashed lines in FIG. 5; also, the assembly of the transistors 13, 25 and resistors 14 and 17 is shown symbolically for the sake of simplicity in FIG. 5 by a current source 28 controlled by a diode 29 (equivalent to the diode 15 of the previous interface).

The matching circuit of the control-electrode current of the switch 26 includes an anti-saturation circuit 30 designed to apply to the control electrode of the switch 26 a current substantially proportional to the current in the switch through its power electrodes, further an output circuit 31 for an inverted control current and designed to generate the blocking (OFF) current.

In this example the antisaturation circuit 30 consists of two diodes 32 and 33 and a transistor 34. During the conduction phase of the static switch 26, the two diodes 32 and 33 conduct simultaneously, applying to the transistor 34 a collector/base voltage near 0; thus the transistor 34 is in nearsaturation and supplies a control current essentially proportional to its current between its power electrodes to the switch 26.

The circuit 31 includes two transistors 35 and 26 which sequentially connect an inductor 37 to the base of the transistor 34, then to the control electrode of the switch 26 in order to sequentially block the transistors 34 and 26. The energy stored in the inductor 37 then is drained into a diode 38. Two resistors 39 and 40 lower the input impedances of the transistors 34 and 26.

FIGS. 6a, 6b and 6c show the shapes of the main signals relating to the above described drive interface.

In this example the polarity signal Sptp assumes a near square wave shaped current as indicated in FIG. 6b. The rising and trailing jumps of this current correspond to the voltage jumps Tce near zero across the power electrodes of the switch 26 (FIG. 6a).

Starting with the rising jump of the current Sptp and during its positive level (corresponding to the conduction state), the antisaturation circuit 30 successively applies to the control electrode of the switch 26 (FIG. 6c) a positive current pulse and a control current substantially proportional to the current through the switch 26 between its power electrodes.

As the negative trailing jump of the current Sptp appears (corresponding to the OFF command), the circuit 31 generates a negative blocking current on the control electrode of the switch 26.

In this manner the current at the control electrode of the switch 26 is thus matched on one hand to the current variations in that switch and on the other hand to this switch's blocking speed.

The interface of the invention also may be applied to driving a field effect transistor (with or without insulated gate); in this case, the low biasing current required to produce the switching of this type of static switch allows simplifying, even eliminating the matching circuit.

We claim:

1. A drive interface for a static electronic switch for insertion between a control stage capable of generating a logical control signal (Sc) including blocking and conducting commands and a static switch (3) capable of controlled current blocking, said static switch being of the blocking transistor type or transistors other than discrete transistors having an applied voltage bias at zero collector current and negatively biased base ($V_{CEX}$) higher than the applied open base voltage bias ($V_{CEO}$), and wherein said static switch further comprises at least one control electrode (3c) and two power electrodes (3a, 3b) and may assume at least a first conducting state characterized by a slight voltage drop across said power electrodes and a second blocking state characterized by a low leakage current between said power electrodes, said states corresponding to different polarities of said control electrode and changes in said states being caused by a change of polarity on said control electrode, said drive interface comprising:

a detection circuit (5) for sensing the voltage across said power electrodes and comprising means for emitting a two-state voltage signal (St) as a function of said sensed voltage, one state corresponding to a voltage of substantially zero across said power electrodes and the other state corresponding to a voltage other than zero.

a drive circuit (6) connected to said detection circuit (5) for receiving said voltage signal (St) from said detection circuit and connected to said control stage (2) for receiving said control signal (Sc) from said control stage and establishing the polarity on said control electrode and including means for carrying out a logical function on said voltage and control signals for applying a two-level polarity signal on said control electrode, one of said levels corresponding to a blocking of said static switch and appearing during an OFF command and/or for the control of the voltage state signal corresponding to a voltage other than zero, and the other of said levels corresponding to the conduction of said static switch and appearing during the conduction state of said control signal and for the voltage signal corresponding to a voltage of substantially zero, said polarity on said control electrode corresponding to said blocking state when (a) said control signal (Sc) corresponds to an OFF command and/or (b) the voltage across said power electrodes is other than zero, and said polarity on said control electrode corresponding to said conducting state when (c) said control signal (Sc) corresponds to a conduction command or (d) the voltage across said power electrodes is substantially zero, said detection circuit further including means (8) for generating a reference voltage (r), said reference voltage being very low relative to the maximum voltage across said power electrodes (3a, 3b), and a comparator (9) connected to said power electrodes and to said generating means for emitting said two-state voltage signal (St) as a function of the relative values of said reference voltage and the voltage across said power electrodes.

2. A drive interface as in claim 1 and including a matching circuit (7) between the output of said drive circuit (6) and said control electrode (3c) for matching the polarity signal to said switch.

3. A drive interface as in claim 1 and including a capacitive circuit (4) across said power electrodes for assisting in switching.

4. A drive interface as in claim 2 and wherein said matching circuit comprises means for carrying out differentiation for emitting opposite pulses during jumps of said polarity signal.

5. A drive interface as in claim 2 and wherein said static switch comprises a bipolar transistor.

6. A drive interface as in claim 5 and wherein said matching circuit includes means for matching the polarity signal for feeding to said control electrode during conduction a current substantially proportional to the current through said switch between said power electrodes and an OFF current for generating said blocking state.

7. A drive interface as in claim 6 and wherein said matching circuit includes an antisaturation circuit (30) for said switch for feeding to said control electrode a current substantially proportional to the current through the switch and an output circuit (31) for an inverted control current for generating said blocking current.

8. A drive interface as in claim 2 and wherein said static switch comprises a field effect transistor.

* * * * *